US012588186B2

(12) United States Patent
Kakumu et al.

(10) Patent No.: US 12,588,186 B2
(45) **Date of Patent: \*Mar. 24, 2026**

(54) MEMORY DEVICE USING SEMICONDUCTOR ELEMENT

(71) Applicant: Unisantis Electronics Singapore Pte. Ltd., Singapore (SG)

(72) Inventors: Masakazu Kakumu, Chiyoda-ku (JP); Koji Sakui, Chiyoda-ku (JP); Nozomu Harada, Chiyoda-ku (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 130 days.

This patent is subject to a terminal disclaimer.

(21) Appl. No.: 18/624,515

(22) Filed: Apr. 2, 2024

(65) Prior Publication Data

US 2024/0349482 A1 Oct. 17, 2024

(30) Foreign Application Priority Data

Apr. 11, 2023 (WO) .................. PCT/JP2023/014698

(51) Int. Cl.
*H10B 12/00* (2023.01)
*G11C 11/404* (2006.01)
*G11C 11/4096* (2006.01)

(52) U.S. Cl.
CPC ............ *H10B 12/20* (2023.02); *G11C 11/404* (2013.01); *G11C 11/4096* (2013.01)

(58) Field of Classification Search
CPC .................................................. H10B 12/20
See application file for complete search history.

(56) References Cited

U.S. PATENT DOCUMENTS

| | | |
|---|---|---|
| 2003/0111681 A1 | 6/2003 | Kawanaka |
| 2006/0157738 A1 | 7/2006 | Kawanaka |

(Continued)

FOREIGN PATENT DOCUMENTS

| | | |
|---|---|---|
| JP | 02-188966 | 7/1990 |
| JP | 2003-188279 A | 7/2003 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991) (6 pages).

(Continued)

*Primary Examiner* — Hoai V Ho
(74) *Attorney, Agent, or Firm* — Crowell & Moring LLP

(57) ABSTRACT

Provided is a memory semiconductor device including an access transistor, in which an n-type semiconductor layer is formed on a p-type semiconductor region provided on a substrate; a first p-type semiconductor layer that has a columnar shape exists in a vertical direction from a portion of the n-type semiconductor layer; an insulating layer that covers a portion of the first p-type semiconductor layer and a portion of the n-type semiconductor layer exists; in contact therewith, a first gate insulating layer contacts the first p-type semiconductor layer; in contact with the first gate insulating layer, a first gate conductive layer exists; a second p-type semiconductor layer whose surface is recessed exists on the first p-type semiconductor layer; a second gate insulating layer and a second gate conductive layer exist thereabove; and an n+ layer is provided on both sides thereof.

11 Claims, 4 Drawing Sheets

(56)                References Cited

U.S. PATENT DOCUMENTS

| | | | |
|---|---|---|---|
| 2006/0192249 A1 | 8/2006 | Kim et al. | |
| 2008/0137394 A1 | 6/2008 | Shimano et al. | |
| 2008/0205133 A1 | 8/2008 | Gonzalez et al. | |
| 2020/0135863 A1 | 4/2020 | Han et al. | |
| 2023/0077140 A1 | 3/2023 | Kakumu et al. | |
| 2023/0247820 A1* | 8/2023 | Kakumu | H10B 12/20 |
| | | | 257/314 |

FOREIGN PATENT DOCUMENTS

| | | |
|---|---|---|
| JP | 2006-295180 | 10/2006 |
| JP | 2008-147514 | 6/2008 |
| JP | 2010-519770 | 6/2010 |
| WO | WO2023/032193 A1 | 3/2023 |

OTHER PUBLICATIONS

H. Chung, H. Kim, H. Kim, K. Kim, S. Kim, K. W. Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011) (4 pages).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010) (27 pages).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007) (4 pages).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) (9 pages).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010) (3 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012) (3 pages).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006). (4 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006. (6 pages).

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007) (7 pages).

Takashi Ohasawa and Takeshi Hamamoto, "Floating Body Cell—a Novel Body Capacitorless DRAM Cell", Pan Stanford Publishing (2011) (140 pages).

K.Sakui, N. Harada,"Dynamic Flash Memory with Dual Gate Surrounding Gate Transistor (SGT)," Proc. IEEE IMW, pp. 72-75(2021) (2 pages).

Yuan Taur and Tak. H. Ning, "Fundamentals of Modern VLSI Devices" (2021). (5 pages).

Written Opinion in Japanese Application No. PCT/JP2023/014698, dated Apr. 23, 2024 (7 pages).

International Search Report and Written Opinion in International Application No. PCT/JP2023/014698, dated Jun. 16, 2023 (English and Japanese Languages) (19 pages).

* cited by examiner

CELL CURRENT
Icell (BL to SL Current)

FIG. 4A
FIG. 4B
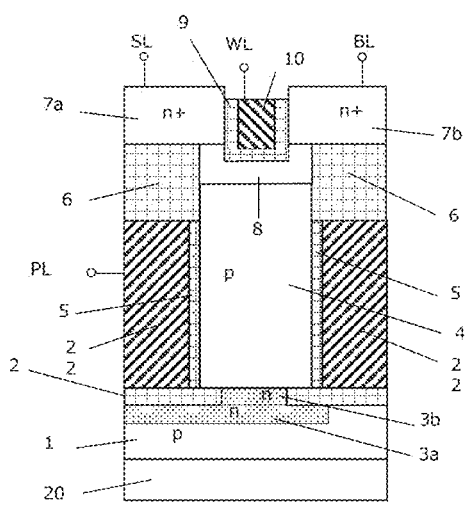
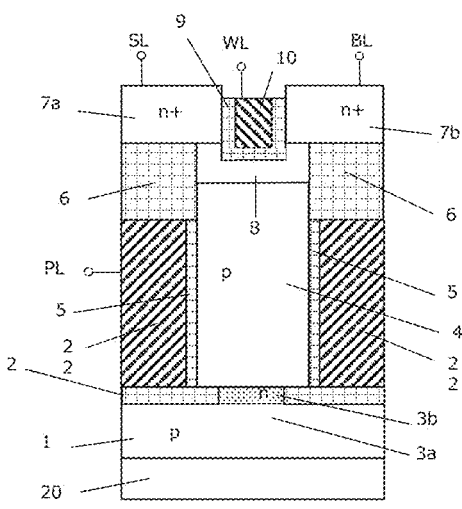

MEMORY DEVICE USING SEMICONDUCTOR ELEMENT

CROSS-REFERENCE TO RELATED APPLICATIONS

This application claims priority to PCT/JP2023/014698, filed Apr. 11, 2023, the entire content of which is incorporated herein by reference.

BACKGROUND OF THE INVENTION

1. Field of the Invention

The present invention relates to a memory device using a semiconductor element.

2. Description of the Related Art

In recent years, in the development of large scale integration (LSI) technology, higher integration, higher performance, lower power consumption, and higher functionality of a memory device using a semiconductor element have been demanded.

In an ordinary planar-type MOS transistor, a channel extends in a horizontal direction along an upper surface of a semiconductor substrate. In contrast, a SGT channel extends in a direction perpendicular to the upper surface of the semiconductor substrate (see, for example, Japanese Unexamined Patent Application Publication No. H2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Therefore, the SGT is capable of achieving higher density of a semiconductor device compared to the planar-type MOS transistor. By using this SGT as a selection transistor, it is possible to achieve higher integration of, for example, the following memories, that is, a dynamic random access memory (DRAM) to which a capacitor is connected (see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT), "2011 Proceeding of the European Solid-State Device Research Conference, (2011)); a phase change memory (PCM) to which a resistance change element is connected (see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No. 12, December, pp. 2201-2227 (2010)); a resistive random access memory (RRAM) (see, for example, T. Tsunoda, K. Kinoshita, H. NoYamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)); and a magneto-resistive random access memory (MRAM) that changes the direction of the magnetic spin by current to change the resistance (see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)).

Furthermore, there is also, for example, a DRAM memory cell constituted by a single MOS transistor without a capacitor (see M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010); J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); Takashi Ohasawa and Takeshi Hamamoto, "Floating Body Cell—a Novel Body Capacitorless DRAM Cell", Pan Stanford Publishing (2011); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida: "A Capacitorless 1T-DRAM Technology Using Gate-Induced Drain-Leakage (GIDL) Current for Low-Power and High-Speed Embedded Memory," IEEE IEDM (2006)). For example, of a group of holes and a group of electrons generated by an impact ionization phenomenon within the channel by the source-drain current of an N-channel MOS transistor, the hole group is retained, either partially or entirely, within the channel to write the logic storage data "1". Then, the hole group is removed from the channel to write the logic storage data "0". For this memory cell, it is an issue to improve the reduction of the operating margin caused by the voltage fluctuation of the floating body channel, and to improve the reduction of the data retention characteristics caused by removing a portion of the hole group, which are signal charges stored in the channel.

In addition, there is a twin-transistor MOS transistor memory element in which one memory cell is formed using two MOS transistors on a SOI layer (see, for example, US 2008/0137394 A1, US 2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp. 765-771 (2007)). Further, there is a dynamic flash memory (DFM) constituted by one memory cell by using two gate electrodes without a capacitor (see K. Sakui, N. Harada, "Dynamic Flash Memory with Dual Gate Surrounding Gate Transistor (SGT)," Proc. IEEE IMW, pp. 72-75 (2021)). In this memory cell, by manipulating the voltages of four electrodes, the carrier concentration in the floating body is changed to produce a conducting state or a nonconducting state and operate the memory. However, as these memories become miniaturized, the capacity of the floating body is decreased, as a result of which there is an issue that the margin of "1" and "0" is decreased.

SUMMARY OF THE INVENTION

Accordingly, it is an object of the present invention to achieve operating margin expansion and higher density of a dynamic flash memory, which is a memory device.

To this end, a memory device using a semiconductor element according to a first aspect includes:

a first semiconductor region;

a first impurity region that exists on the first semiconductor region;

a second semiconductor region that contacts the first impurity region and that extends in a vertical direction;

a first gate insulating layer that covers a portion of the second semiconductor region;

a first gate conductive layer that contacts the first gate insulating layer;

a first insulating layer that is formed so as to contact the first gate conductive layer and the first gate insulating layer;

a third semiconductor region that contacts the second semiconductor region and whose vertical cross section is recessed;

a second gate insulating layer that is formed along at least a recessed portion of the third semiconductor region and whose vertical cross section is recessed;

a second gate conductive layer that is formed on an inner side of a recessed portion of the second gate insulating layer; and a second impurity region and a third impurity region that are each formed so as to contact an upper surface of a corresponding one of protruding portions of the recessed portion of the third semiconductor region.

According to a second aspect, in the first aspect above, the contact surface where the third semiconductor region and the second impurity region contact each other or the contact surface where the third semiconductor region and the third impurity region contact each other exits at a position higher than a bottom portion of the second gate insulating layer.

According to a third aspect, in the first aspect above, in a horizontal cross section formed by cutting at a right angle with respect to a direction of extension of the second semiconductor region, a horizontal cross-sectional area of the second semiconductor region is larger than a horizontal cross-sectional area of the second gate conductive layer.

According to a fourth aspect, in the first aspect above, a majority carrier of the first impurity region differs from a majority carrier of the first semiconductor region.

According to a fifth aspect, in the first aspect above, a majority carrier of the second semiconductor region is same as a majority carrier of the first semiconductor region.

According to a sixth aspect, in the first aspect above, a majority carrier of the second impurity region and a majority carrier of the third impurity region are same as a majority carrier of the first impurity region.

According to a seventh aspect, in the first aspect above, a vertical distance from a bottom portion of the third semiconductor region to an upper portion of the first impurity region is shorter than a vertical distance from the bottom portion of the third semiconductor region to a bottom portion of the first gate conductive layer.

According to an eighth aspect, in the first aspect above, the first impurity region is shared by a plurality of memory cells that are adjacent to each other.

According to a ninth aspect, in the first aspect above, by changing a voltage that is applied to the first gate conductive layer, a threshold value of a MOS transistor including the third semiconductor region, the second impurity region, the third impurity region, the second gate insulating layer, and the second gate conductive layer is manipulated.

According to a tenth aspect, in the first aspect above, the memory device further includes:

a first wire conductive layer that is connected to the second impurity region;

a second wire conductive layer that is connected to the third impurity region;

a third wire conductive layer that is connected to the second gate conductive layer;

a fourth wire conductive layer that is connected to the first gate conductive layer; and a fifth wire conductive layer that is connected to the first impurity region, in which a memory writing operation is performed by controlling voltages that are applied to the first wire conductive layer, the second wire conductive layer, the third wire conductive layer, the fourth wire conductive layer, and the fifth wire conductive layer, and performing operations including an operation of generating an electron group or a hole group in the third semiconductor region and the second semiconductor region by an impact ionization phenomenon where a current flows between the second impurity region and the third impurity region or by a gate-induced drain leakage current, an operation of removing, of the electron group and the hole group that are generated, a minority carrier in the third semiconductor region and a minority carrier in the second semiconductor region, and an operation of causing a majority carrier in the third semiconductor region and a majority carrier in the second semiconductor region to partly or entirely remain in the third semiconductor region and the second semiconductor region, and in which a memory erasing operation is performed by controlling the voltages that are applied to the first wire conductive layer, the second wire conductive layer, the third wire conductive layer, the fourth wire conductive layer, and the fifth wire conductive layer and extracting the majority carrier remaining in the second semiconductor region or the majority carrier remaining in the third semiconductor region from at least one of the first impurity region, the second impurity region, the third impurity region, and the fourth impurity region as a result of recombining the majority carrier remaining in the second semiconductor region or the majority carrier remaining in the third semiconductor region with a majority carrier of the first impurity region, a majority carrier of the second impurity region, and a majority carrier of the third impurity region.

According to an eleventh aspect, in the tenth aspect above, the first wire conductive layer that is connected to the third impurity region is a source line, the second wire conductive layer that is connected to the fourth impurity region is a bit line, the third wire conductive layer that is connected to the second gate conductive layer is a word line, the fourth wire conductive layer that is connected to the first gate conductive layer is a plate line, and the fifth wire conductive layer is a control line, and the memory writing operation and the memory erasing operation are performed by applying a voltage to each of the source line, the bit line, the plate line, the word line, and the control line.

BRIEF DESCRIPTION OF THE DRAWINGS

FIGS. 4A and 4B each show a cross-sectional structure of an additional example 1 of the memory device using a semiconductor element according to the first embodiment.

DESCRIPTION OF THE PREFERRED EMBODIMENTS

A structure of a memory device using a semiconductor element, a driving method, and the behavior of storage carriers according to an embodiment of the present invention will be described below with reference to the drawings.

First Embodiment

Using FIGS. 1A to 3B, a cell structure and an operation of a memory using a semiconductor element according to an embodiment will be described. Using FIGS. 1A and 1B, the cell structure of the memory using a semiconductor element of the embodiment is described. Using FIGS. 2A to 2C, a writing mechanism of a memory cell and the behavior of carriers are described. Using FIGS. 3A and 3B, an erasing mechanism of the memory cell and the behavior of carriers are described. Using FIGS. 4A and 4B, an application example of the embodiment is described.

Figure 1A:
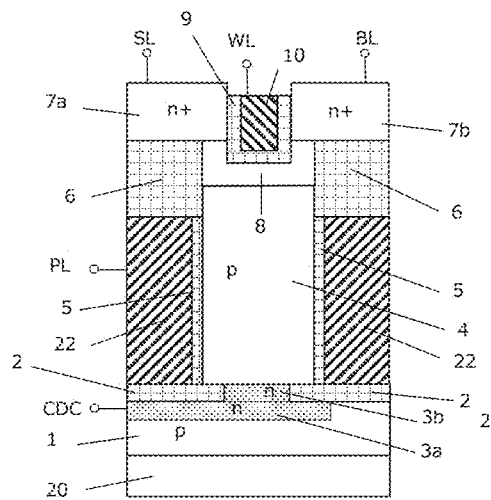
FIGS. 1A and 1B are each a bird's-eye view of a cross-sectional structure of a memory device using a semiconductor element according to a first embodiment.

FIG. 1A shows a vertical cross-sectional structure of the memory using a semiconductor element according to the embodiment. A silicon p layer 1 (which is an example of a "first semiconductor region" in the claims) that is a p-type conductive layer including an acceptor impurity exists on a substrate 20. An n layer 3a (which is an example of a "first impurity region" in the claims) that contacts the p layer 1 and includes a donor impurity exists. An n layer 3b that contacts a portion of an upper surface of the n layer 3a, stands in a vertical direction, and is a portion of the columnar first impurity region exists. A columnar p layer 4 (which is an example of a "second semiconductor region" in the claims) that contacts an upper surface of the n layer 3b, includes an acceptor impurity, and whose horizontal cross section is rectangular exists. A first insulating layer 2 that partly covers the p layer 1, the n layer 3a, the n layer 3b, and the p layer 4 exists. A first gate insulating layer 5 (which is an example of a "first gate insulating layer" in the claims) that contacts an upper surface of the first insulating layer 2 and partly covers side surfaces of the p layer 4 exists. A first gate conductive layer 22 (which is an example of a "first gate conductive layer" in the claims) contacts the first insulating layer 2 and the first gate insulating layer 5. A second gate insulating layer 6 (which is an example of a "first insulating layer" in the claims) that contacts an upper portion of the gate insulating layer 5 and an upper portion of the gate conductive layer 22 exists. A p layer 8 (which is an example of a "third semiconductor region" in the claims) that contacts an upper portion of the p layer 4, that includes an acceptor impurity, and whose upper surface is recessed exists.

An n+ layer 7a (which is an example of a "second impurity region" in the claims) and an n+ layer 7b (which is an example of a "third impurity region" in the claims) that each contact an upper surface of a corresponding one of two ends of the p layer 8 in a left-right direction in FIG. 1A and include a high concentration of a donor impurity exist.

A second gate insulating layer 9 (which is an example of a "second gate insulating layer" in the claims) that extends along an upper surface of the recessed portion of the p layer 8 and whose upper portion is likewise recessed exists. The gate insulating layer 9 contacts each of the n+ layer 7a and the n+ layer 7b. A second gate conductive layer 10 (which is an example of a "second gate conductive layer" in the claims) exists on an inner side of the recessed upper portion of the gate insulating layer 9.

Figure 1B:
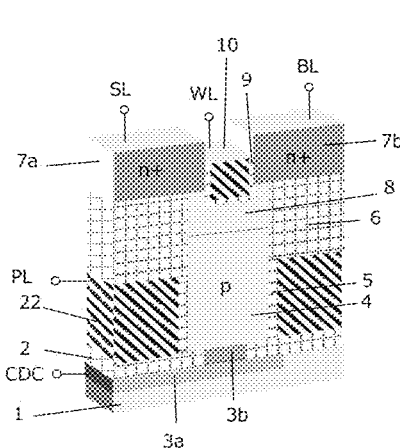

FIG. 1B is a three-dimensional bird's eye view of a cross section of the memory cell of the embodiment, the cross section being formed by cutting the memory cell in the vertical direction. As shown in FIGS. 1A and 1B, the memory device using a semiconductor element and including the p layer 1, the first insulating layer 2, the n layer 3a, the n layer 3b, the p layer 4, the n+ layer 7a, the n+ layer 7b, the p layer 8, the first gate insulating layer 5, the second gate insulating layer 6, the first gate conductive layer 22, the second gate insulating layer 9, and the second gate conductive layer 10 is formed.

Further, the N+ layer 7a is connected to a source line SL (which is an example of a "source line" in the claims) that is a first wire conductive layer, the N+ layer 7b is connected to a bit line BL (which is an example of a "bit line" in the claims) that is a second wire conductive layer, the gate conductive layer 10 is connected to a word line WL (which is an example of a "word line" in the claims) that is a third wire conductive layer, the gate conductive layer 22 is connected to a plate line PL (which is an example of a "plate line" in the claims) that is a fourth wire conductive layer, and the n layer 3a is connected to a control line CDC (which is an example of a "control line" in the claims) that is a fifth wire conductive layer. By manipulating the applied voltages to the source line SL, the bit line BL, the plate line PL, the word line WL, and the control line CDC, the memory is operated. The memory device is hereunder called a dynamic flash memory.

Note that, although, in each of FIGS. 1A and 1B, the shape of the recessed portion of the vertical cross section of the p layer 8 is such that its figure is shown by a straight line, the p layer 8 may be such that a portion in which a corner portion or a vertical cross-sectional portion is curved is a U shape or a semielliptical shape. As a result, a surface of the p layer 8 becomes a curved surface. A bottom surface of the second gate insulating layer 9 and a bottom surface of the second gate conductive layer 10 each of whose shape is formed so as to follow the shape of the surface of the p layer 8 may have a curved shape.

Although, in FIGS. 1A and 1B, the memory cell is illustrated such that a vertical cross-sectional structure of the p layer 4 and a vertical cross-sectional structure of the p layer 8 have a rectangular shape with respect to the sheet plane, the vertical cross-sectional structures may have a trapezoidal shape, a polygonal shape, a circular shape, or an elliptical shape. Although the p layer 4 and the p layer 8 have been described by taking as an example the case in which the p layer 4 and the p layer 8 are perpendicular with respect to the substrate 20, the present invention is applicable to the case in which the p layer 4 and the p layer 8 are formed by being extended in the horizontal direction with respect to the substrate 20.

Although, in FIGS. 1A and 1B, the n+ layer 7a that is connected to the source line and the n+ layer 7b that is connected to the bit line BL contact the upper surface of the p layer 8, the n+ layer 7a and the n+ layer 7b may contact a corresponding one of side surfaces of the p layer 8. Alternatively, the n+ layer 7a and the n+ layer 7b may contact both the upper surface and the side surface.

Although, in FIGS. 1A and 1B, the first semiconductor region 1 has been described as a p-type semiconductor, even if an n-type semiconductor substrate is used for the substrate 20, a p well is formed, the resulting structure is used as the first semiconductor region 1, and the memory cell of the present invention is disposed, the dynamic flash memory is operated.

Although, in FIGS. 1A and 1B, the n layer 3a and the n layer 3b are separately shown, they may be a continuous semiconductor region. Although, in FIGS. 1A and 1B, a boundary line between the n layer 3a and the n layer 3b is shown so as to coincide with a bottom portion of the insulating layer 2, the boundary line need not coincide with the bottom portion of the insulating layer 2. Any structure may be used as long as, in the vertical direction, an upper portion of the n layer 3b is positioned at the same height as or at a higher height than a bottom portion of the gate conductive layer 22, an inversion layer is formed when a voltage is applied to the gate conductive layer 22, and this can contact the n layer 3b. That is, the condition is that, from a bottom portion of the p layer 8, a vertical distance to the n layer 3b is to be shorter than a vertical distance to the bottom portion of the gate conductive layer 22. In FIGS. 1A and 1B, if the n layer 3a exists below the memory cell, in plan view, the n layer 3a may exist along the entire surface of a memory cell region, or the n layer 3a may not be formed. Further, the n layer 3a may be formed by an n well in the p layer 1. Note that the n layer 3a and the n layer 3b may together be subsequently referred to as n layer 3.

Although, in FIGS. 1A and 1B, the insulating layer 2 and the gate insulating layer 5 are distinguished from each other, they may be integrally formed.

Although, in FIGS. 1A and 1B, the p layer 8 is described as being a p-type semiconductor, the type depends upon the majority carrier concentration of the p layer 4, the thickness of the p layer 8, the material and the thickness of the gate insulating layer 9, and the material of the gate conductive layer 10, and thus the p layer 8 can be a p-type semiconductor, an n-type semiconductor, or an i-type semiconductor.

The substrate 20 can be an insulator, a semiconductor, or a conductor, and can be made of any material as long as the material can support the p layer 1.

The optimal value of the impurity concentration of the p layer 4 is determined by the quantity of excess holes to be stored in the memory with, for example, the volume of the p layer 4, the thickness of the first gate insulating layer, the material of the first gate conductive layer, and the voltage to be applied being parameters. On the other hand, the impurity concentration of the p layer 8 primarily depends upon the material of the second gate insulating layer, the material of the second gate conductive layer, and the voltage to be applied, and is determined by electrical characteristics required of a MOSFET of an access transistor. Therefore, the impurity concentration and the profile of the p layer 4 and the impurity concentration and the profile of the p layer 4 are independently set. The p layer 4 and the p layer 8 may be formed from different semiconductor material layers.

Although, in FIGS. 1A and 1B, the p layer 1 is a p-type semiconductor, its profile may exist in the impurity concentration. The profile may exist in the impurity concentrations of the n layer 3a and the n layer 3b. In a direction of connection to the n+ layers 7a and 7b, the p layer 8 may be longer or shorter than the p layer 4. A lightly doped drain (LDD) region having a donor concentration that is lower than the donor impurity concentrations of the n+ layers 7a and 7b may be provided between the p layer 8 and the n+ layers 7a and 7b.

As long as the first to fifth wire conductive layers do not contact one another, they may be formed into a multilayer.

For the gate insulating layers 5 and 9, any insulating films that are used in an ordinary MOS process, such as an $SiO_2$ film, an SiON film, an HfSiON film, or an $SiO_2$/SiN layered film, can be used.

As long as the first gate conductive layer 22 changes the electrical potential of a portion of the memory cell through the gate insulating layer 5 or the second gate conductive layer 10 changes the electrical potential of a portion of the memory cell through the gate insulating layer 9, the first gate conductive layer 22 or the second gate conductive layer 10 may be made of, for example, a metal, such as W, Pd, Ru, Al, TiN, TaN, or WN, a metal nitride, or an alloy thereof (including silicide), or may be a layered structure such as TiN/W/TaN, or may be formed from a semiconductor doped to a high concentration.

In FIGS. 1A and 1B, in plan view, the first gate conductive layer 22 may surround the entire p layer 4 with the insulating layer 5 therebetween, or may partly cover the p layer 4. In plan view, the first gate conductive layer 22 may be divided into a plurality of first gate conductive layers 22. In the vertical direction, the first gate conductive layer 22 may be divided into a plurality of first gate conductive layers 22. Although, even in the cross-sectional structure, in FIGS. 1A and 1B, the first gate conductive layer 22 exists on both sides of the p layer 4, as long as the first gate conductive layer 22 exists on one of the sides of the p layer 4, the dynamic flash memory can be operated.

In the case in which the n+ layer 7a and the n+ layer 7b are formed from a semiconductor region p+ layer whose holes are majority carriers and that includes a high concentration of acceptor impurities, when n-type semiconductors are used for the p layer 1, the p layer 4, and the p layer 8 and p-type semiconductors are used for the n layer 3a and the n layer 3b, the dynamic flash memory in which writing carriers are electrons is operated.

In the actual memory device of the embodiment, one dynamic flash memory cell described above is disposed on the substrate 20, or a plurality of dynamic flash memory cells are two-dimensionally disposed on the substrate 20.

Figure 2A:
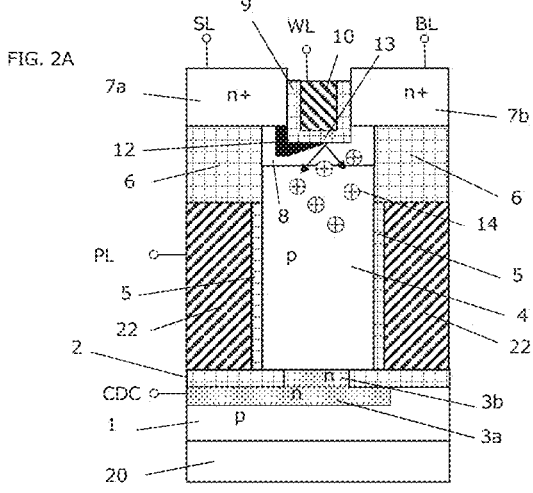
FIGS. 2A, 2B and 2C are each a diagram for illustrating hole carrier storage and cell current when performing a writing operation of the memory device using a semiconductor element according to the first embodiment.
Figure 2B:
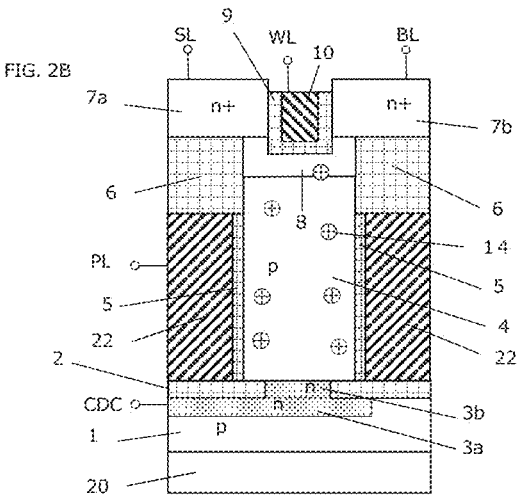
Figure 2C:
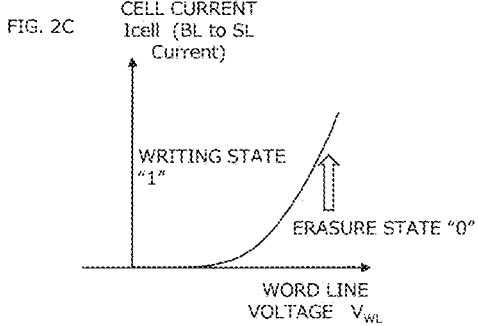

With reference to FIGS. 2A to 2C, carrier behavior, carrier storage, and cell current when a writing operation of the dynamic flash memory according to the first embodiment of the present invention is performed are described. First, the case in which the majority carriers of the n layer 3a, the n layer 3b, the n+ layer 7a, and the n+ layer 7b are electrons, in which poly-Si including a high concentration of donor impurities (hereunder poly-Si including a high concentration of donor impurities is referred to as "n+poly") is used in, for example, the gate conductive layer 22 connected to the plate line PL and the gate conductive layer 10 connected to the word line WL, and in which a p-type semiconductor is used as the third semiconductor region 8 is described. As shown in FIG. 2A, a MOSFET in the memory cell operates with the n+ layer 7a, which becomes a source, the n+ layer 7b, which becomes a drain, the gate insulating layer 9, the gate conductive layer 10, which becomes a gate, and the p layer 8, which becomes the substrate, being used as structural elements. For example, 0 V is applied to the p layer 1; for example, 0.5 V is applied to the n layer 3a connected to the control line CDC; for example, 0 V is input to the n+ layer 7a connected to the source line SL; for example, 1.0 V is input to the n+ layer 7b connected to the bit line BL; and, for example, −1 V is applied to the gate conductive layer 22 connected to the plate line PL. Here, the threshold value of the MOSFET in which the gate conductive layer 10 before the writing is a gate electrode is, for example, 1.0 V when the voltage of the plate line PL is −1 V. Next, when, for example, 1.5 V is input to the gate conductive layer 10 connected to the word line WL, an inversion layer 12 is partly formed directly below the gate insulating layer 9 that is situated below the gate conductive layer 10, and a pinch-off point 13 exists. In this case, the MOSFET including the gate conductive layer 10 operates in a saturation region.

As a result, in the MOSFET including the gate conductive layer 10, the electrical field becomes a maximum between the pinch-off point 13 and the n+ layer 7b, and an impact ionization phenomenon occurs in this region. Due to the impact ionization phenomenon, electrons accelerated from the n+ layer 7a connected to the source line SL toward the n+ layer 7b connected to the bit line BL collide with an Si lattice, generating electron-hole pairs due to their kinetic energy. Due to the concentration gradient of the generated holes, the holes spread toward a location where the concentration of holes is low. Although a portion of the generated electrons flow to the gate conductive layer 10, most of the electrons flow to the n+ layer 7b connected to the bit line BL. As a result, a hole group 14 is stored in the p layer 4 or the p layer 8.

In the example above, the voltage of the plate line PL is −1 V, which contributes to storing the holes generated by impact ionization so as not to widen the depletion layer in the p layer 4 and adjusting the threshold voltage of the MOSFET in the memory cell by a substrate bias effect.

Although, in the example above, n+poly is used in the gate conductive layer 22 and a negative voltage is a bias voltage, even if a material having a work function that is higher than that of the material of the gate conductive layer 10 is used, an effect that is the same as that when a negative voltage is applied can be provided.

As shown in FIGS. 1A and 1B, the width of the p layer 4 is made wider than the planar-view width of the second gate conductive layer 10 to increase the storage quantity of excess holes.

Instead of causing the impact ionization phenomenon above to occur, the hole group may be generated by causing a gate-induced drain leakage (GIDL) current to flow (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)).

FIG. 2B shows the hole group 14 existing in the p layer 4 and the p layer 8 when, immediately after writing, the voltage of the plate line PL has become-1 V, the bias voltage of the word line WL, the source line SL, and the bit line BL has become 0 V, and the bias voltage of the control line CDC has become 0.5 V. The generated hole group 14 constitutes the majority carriers in the p layer 4 and the p layer 8, and the concentration of the generated holes temporarily becomes a high concentration in the region of the p layer 8 and the hole group 14 moves by spreading toward the p layer 4 due to the gradient of the concentration. Further, in order to apply a negative electrical potential to the first gate conductive layer 22, the hole group 14 is stored at a higher concentration at the p layer 4 near the first gate insulating layer 5. Since the p layer 4 and the p layer 8 are electrically connected to each other, the p layer 8, which is the substrate of the MOSFET including the gate conductive layer 10, is substantially charged to a positive bias. The threshold voltage of the MOSFET including the gate conductive layer 10 is decreased due to the positive substrate bias effect by the holes temporarily stored in the p layer 4 and the p layer 8. In the case of the example, as shown in FIG. 2C, the threshold voltage of the MOSFET including the gate conductive layer 10 connected to the word line WL becomes approximately 0.6 V, which is lower than that before the writing. The writing state is assigned to the logic storage data "1".

In addition to the example above, for example, when the voltage applied to the bit line BL above, the voltage applied to the plate line PL above, and the voltage applied to the word line WL above are V-BL, V-PL, and V-WL, respectively, the voltage application condition can be a combination of, for example, 1.0 V(V-BL)/−1 V(V-PL)/2.0 V(V-WL) or 1.0 V(V-BL)/−0.5 V(V-PL)/1.2 V(V-WL), 1.5 V(V-BL)/−1 V(V-PL)/2.0 V(V-WL), with SL being 0 V. The voltage relationship between the bit line BL and the source line SL may be such that their voltages to be applied are interchanged. However, when 1.0 V is applied to the bit line BL, 0 V is applied to the source line SL, 2 V is applied to the word line WL, and −1 V is applied to the plate line PL, the threshold value is decreased during the writing and the pinch-off point 13 gradually shifts toward the n+ layer 7b, as a result of which the MOSFET may perform a linear operation.

Figure 3A:
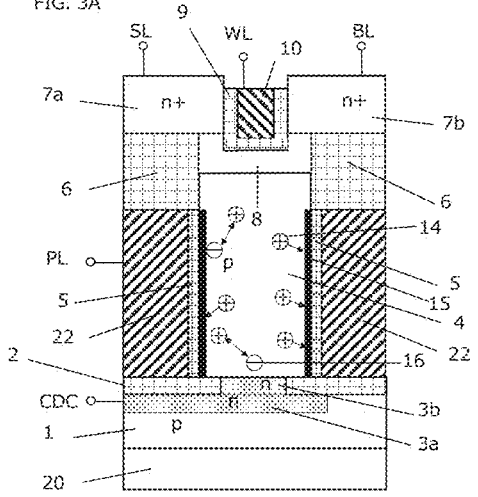
FIGS. 3A and 3B are each a diagram for illustrating an erasing operation of the memory device using a semiconductor element according to the first embodiment.
Figure 3B:
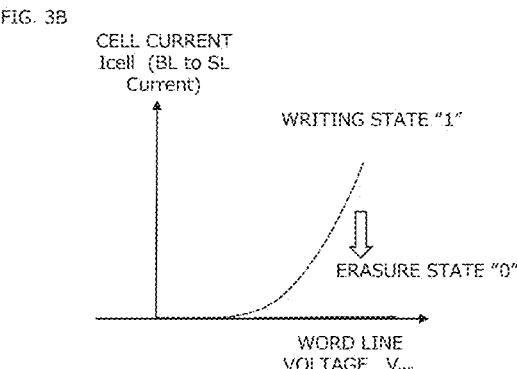

Next, an erasing operation mechanism is described using FIGS. 3A and 3B. As shown in FIG. 3A, at the time of the erasing operation, the voltage of the source line SL, the bit line BL, and the word line WL is 0 V, and the voltage of the control line CDC is 0.5 V. In addition, the voltage of the plate line PL is, for example, 2 V. As a result, regardless of the value of the initial electrical potential of the p layer 8, an inversion layer 15 for electrons is formed at the interface between the insulating layer 5 and the p layer 4. Therefore, the holes of the hole group 14 stored in the p layer 4 flows from the p layer 4 to the inversion layer 15 and recombine with electrons 16. The electrons that have disappeared by the recombination are replenished from the inversion layer 15 that are in contact through the n layer 3a and the n layer 3b. As a result of the recombination of the holes and the electrons, the concentration of the holes in the p layer 4 and the p layer 8 is decreased with time, and the threshold voltage of the MOSFET becomes higher than when "1" is written. For example, here, when the voltage of the plate line PL is −1 V, the threshold value of the MOSFET becomes 1.2 V.

Therefore, as shown in FIG. 3B, even if a voltage is applied to the MOSFET including the gate conductive layer 10 to which the word line WL is connected, almost no current flows therethrough and an erasure state results. This state is defined to be the logic storage data of the dynamic flash memory of "0".

According to the structure of the embodiment, since the vertical cross section of the p layer 8 is recessed, the effective distance between the n+ layer 7a and the n+ layer 7b is increased, and it is possible to decrease the leakage current of the MOSFET when the logic storage data is "0".

As examples of the data erasing method other than the example given above, when the voltage applied to the bit line BL above, the voltage applied to the plate line PL above, and the voltage applied to the word line WL above are V-BL, V-PL, and V-WL, respectively, the voltage application condition can be a combination of, for example, 0 V(V-BL)/2 V(W-PL)/−1 V(V-WL) or 0.4 V(V-BL)/2 V(V-PL)/0.5 V(V-WL) or 1 V(V-BL)/1.5 V(V-PL)/0 V(V-WL), with the source line SL being at 0 V and the control line CDC being at 0.5 V. However, the voltage condition for applying voltages to the bit line BL above, the source line SL above, the word line WL above, and the plate line PL above is one example for performing the memory erasing operation, and other operation conditions that allow the memory erasing operation to be performed are possible.

The insulating layer 2 and the gate insulating layer 5 can be formed at the same time. The insulating layer 2 and the gate insulating layer 5 can be made of the same material or different materials. It is possible to adjust the voltage that is applied to the gate conductive layer 22 by adjusting the film thicknesses of the gate insulating layer 5 and the insulating layers 2 and 6.

Although the control line CDC has been described as being at 0.5 V when performing either the writing operation or the erasing operation of the memory, the control line CDC can be at ground voltage, that is, at 0 V.

According to the embodiment, since the erasing operation of the memory can be performed even if a positive voltage is applied to the plate line PL at the time of the erasing operation, pieces of information about a plurality of cells that share the gate conductive layer 22 can be erased all at once.

Since the memory cell of the present invention is formed by an area of one MOSFET in a planar view, when the source line and the bit line are shared by memory cells that are adjacent to each other, it is possible to realize a memory cell array having a density that is higher than that of a dynamic RAM of the related art.

Next, using FIGS. 4A and 4B, an additional application example of the dynamic flash memory of the present invention is described. In FIGS. 4A and 4B, structural portions that are the same as or similar to those in FIGS. 1A and 1B are given the same reference numerals.

As shown in FIG. 4A, the n layer 3a in FIGS. 1A and 1B is not connected to the control line CDC. The other structural features are the same as those in FIGS. 1A and 1B. In this case, for example, 0 V is applied to the p layer 1. Therefore, the dynamic flash memory is normally operated.

As shown in FIG. 4B, even a structure in which a plurality of cells do not share the n layer 3 and in which an n layer 3 is individually disposed on the bottom portion of a p layer 4 in each memory cell can operate as the dynamic flash memory.

Even in the structures in both of FIGS. 4A and 4B, it is possible to perform a writing operation, an erasing operation, and a reading operation of the dynamic flash memory by applying voltages that are the same as those in the first embodiment to, excluding the control line CDC, the source line SL, the plate line PL, the word line WL, and the bit line BL. Therefore, although the operating voltage needs to be adjusted, compared to the structure shown in FIGS. 1A and 1B, one wire structure becomes unnecessary, and, from the viewpoint of manufacturing, the process is simplified.

The embodiment has the following features.

Feature 1

The MOSFET, which is an access transistor of the dynamic flash memory according to the embodiment, includes an n+ layer 7a, an n+ layer 7b, a p layer 8, a second gate insulating layer 9, and a second gate conductive layer 10. Since the vertical cross section of the p layer 8 is recessed, the electric force lines from the second gate conductive layer 10 to the p layer 8, which is a channel portion of the MOSFET, do not concentrate and are scattered. As a result, a back gate bias effect is increased, and, compared to a parallel plate or a FIN-type MOSFET, the dependence of the threshold value of the access transistor on the carrier concentration is increased, and the margin of the memory operation is widened.

Feature 2

In the embodiment, since the vertical cross section of a channel p-layer-8 vertical cross section of the MOSFET including an n+ layer 7a, an n+ layer 7b, a p layer 8, a gate insulating layer 9, and a gate conductive layer has a recessed structure, the effective distance between the n+ layer 7a and the n+ layer 7b can be made larger than the width of the gate conductive layer 10 in planar view, and it is possible to realize a MOSFET having a small leakage current with the memory in an off state.

Feature 3

In the embodiment, as described in Feature 2, since it is possible to dispose an access transistor whose gate length is short in planar view, it is possible to dispose a high-density memory.

Feature 4

The p layer 8, which is one structural element of the MOSFET in the dynamic flash memory according to the embodiment, is connected to the p layer 4, the n layer 3a, the n layer 3b, and the p layer 1, and, by adjusting the voltage that is applied to the gate conductive layer 22, it is possible to freely set the threshold value of the MOSFET of an access transistor. Further, since a location below the MOSFET is not completely depleted, it is not largely affected by coupling of the gate electrode from the word line of a floating body, which is a shortcoming of DRAM not including a capacitor. That is, according to the present invention, it is possible to design the dynamic flash memory with a wide operating voltage margin.

Feature 5

In the dynamic flash memory according to the first embodiment of the present invention, as long as a plurality of cells are disposed in the n layer 3 and the gate conductive layer 22 is shared, a certain erasing operation of the plurality of cells can be performed on by an operation that is performed once.

Feature 6

In the dynamic flash memory according to the first embodiment of the present invention, since the structural elements, that is, the n+ layer 7a, the n+ layer 7b, the p layer 8, the second gate insulating layer 9, and the second gate conductive layer 10 can be formed in the same process as a source, drain, a substrate, a gate oxide film, and a gate electrode, which constitute a peripheral CMOS, it is possible to provide a structure in which there is compatibility between a high-density memory cell array and a peripheral CMOS circuit.

According to the present invention, it is possible to provide a semiconductor memory device having a higher density, a higher speed, and a wider operating margin than those of a semiconductor memory device of the related art.

What is claimed is:

1. A memory device using a semiconductor element, the memory device comprising:
   a first semiconductor region;
   a first impurity region that exists on the first semiconductor region;
   a second semiconductor region that contacts the first impurity region and that extends in a vertical direction;
   a first gate insulating layer that covers a portion of the second semiconductor region;
   a first gate conductive layer that contacts the first gate insulating layer;
   a first insulating layer that is formed so as to contact the first gate conductive layer and the first gate insulating layer;
   a third semiconductor region that contacts the second semiconductor region and whose vertical cross section is recessed;
   a second gate insulating layer that is formed along at least a recessed portion of the third semiconductor region and whose vertical cross section is recessed;
   a second gate conductive layer that is formed on an inner side of a recessed portion of the second gate insulating layer; and
   a second impurity region and a third impurity region that are each formed so as to contact an upper surface of a corresponding one of protruding portions of the recessed portion of the third semiconductor region,
   wherein a contact surface where the third semiconductor region and the second impurity region contact each other or a contact surface where the third semiconductor region and the third impurity region contact each other exits at a position lower than a surface of the second gate conductive layer.

2. The memory device using a semiconductor element according to claim 1, wherein the contact surface where the third semiconductor region and the second impurity region contact each other or the contact surface where the third semiconductor region and the third impurity region contact each other exits at a position higher than a bottom portion of the second gate insulating layer.

3. The memory device using a semiconductor element according to claim 1, wherein, in a horizontal cross section formed by cutting at a right angle with respect to a direction of extension of the second semiconductor region, a horizontal cross-sectional area of the second semiconductor region is larger than a horizontal cross-sectional area of the second gate conductive layer.

4. The memory device using a semiconductor element according to claim 1, wherein a majority carrier of the first impurity region differs from a majority carrier of the first semiconductor region.

5. The memory device using a semiconductor element according to claim 1, wherein a majority carrier of the second semiconductor region is same as a majority carrier of the first semiconductor region.

6. The memory device using a semiconductor element according to claim 1, wherein a majority carrier of the second impurity region and a majority carrier of the third impurity region are same as a majority carrier of the first impurity region.

7. The memory device using a semiconductor element according to claim 1, wherein a vertical distance from a bottom portion of the third semiconductor region to an upper portion of the first impurity region is shorter than a vertical distance from the bottom portion of the third semiconductor region to a bottom portion of the first gate conductive layer.

8. The memory device using a semiconductor element according to claim 1, wherein the first impurity region is shared by a plurality of memory cells that are adjacent to each other.

9. The memory device using a semiconductor element according to claim 1, wherein, by changing a voltage that is applied to the first gate conductive layer, a threshold value of a MOS transistor including the third semiconductor region, the second impurity region, the third impurity region, the second gate insulating layer, and the second gate conductive layer is manipulated.

10. The memory device using a semiconductor element according to claim 1, the memory device comprising:
a first wire conductive layer that is connected to the second impurity region;
a second wire conductive layer that is connected to the third impurity region;

a third wire conductive layer that is connected to the second gate conductive layer;
a fourth wire conductive layer that is connected to the first gate conductive layer; and
a fifth wire conductive layer that is connected to the first impurity region,
wherein a memory writing operation is performed by controlling voltages that are applied to the first wire conductive layer, the second wire conductive layer, the third wire conductive layer, the fourth wire conductive layer, and the fifth wire conductive layer, and performing operations including an operation of generating an electron group or a hole group in the third semiconductor region and the second semiconductor region by an impact ionization phenomenon where a current flows between the second impurity region and the third impurity region or by a gate-induced drain leakage current, an operation of removing, of the electron group and the hole group that are generated, a minority carrier in the third semiconductor region and a minority carrier in the second semiconductor region, and an operation of causing a majority carrier in the third semiconductor region and a majority carrier in the second semiconductor region to partly or entirely remain in the third semiconductor region and the second semiconductor region, and
wherein a memory erasing operation is performed by controlling the voltages that are applied to the first wire conductive layer, the second wire conductive layer, the third wire conductive layer, the fourth wire conductive layer, and the fifth wire conductive layer and extracting the majority carrier remaining in the second semiconductor region or the majority carrier remaining in the third semiconductor region from at least one of the first impurity region, the second impurity region, the third impurity region, and the fourth impurity region as a result of recombining the majority carrier remaining in the second semiconductor region or the majority carrier remaining in the third semiconductor region with a majority carrier of the first impurity region, a majority carrier of the second impurity region, and a majority carrier of the third impurity region.

11. The memory device using a semiconductor element according to claim 10, wherein the first wire conductive layer that is connected to the third impurity region is a source line, the second wire conductive layer that is connected to the fourth impurity region is a bit line, the third wire conductive layer that is connected to the second gate conductive layer is a word line, the fourth wire conductive layer that is connected to the first gate conductive layer is a plate line, and the fifth wire conductive layer is a control line, and
wherein the memory writing operation and the memory erasing operation are performed by applying a voltage to each of the source line, the bit line, the plate line, the word line, and the control line.

* * * * *